US006563222B1

(12) United States Patent
Nogami et al.

(10) Patent No.: US 6,563,222 B1
(45) Date of Patent: May 13, 2003

(54) METHOD AND APPARATUS FOR REDUCING ELECTROMIGRATION IN SEMICONDUCTOR INTERCONNECT LINES

(75) Inventors: Takeshi Nogami, Atsugi (JP); Sergey Lopatin, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/999,703

(22) Filed: Oct. 24, 2001

Related U.S. Application Data

(62) Division of application No. 09/294,454, filed on Apr. 19, 1999, now Pat. No. 6,346,470.

(51) Int. Cl.[7] ............................................. H01L 23/48
(52) U.S. Cl. ...................................... 257/767; 438/659
(58) Field of Search ................................ 257/767, 774, 257/776; 438/659

(56) References Cited

U.S. PATENT DOCUMENTS

| 4,907,066 | A | * | 3/1990 | Thomas ........................ 357/71 |
| 5,633,199 | A | * | 5/1997 | Fiordalice et al. ........... 438/642 |
| 5,646,448 | A | * | 7/1997 | Klein et al. .................. 257/751 |
| 5,654,245 | A | * | 8/1997 | Allen ........................... 438/629 |
| 6,306,732 | B1 | * | 10/2001 | Brown ......................... 438/468 |

* cited by examiner

*Primary Examiner*—David Nelms
*Assistant Examiner*—Quoc Hoang
(74) *Attorney, Agent, or Firm*—LaRiviere, Grubman & Payne, LLP

(57) ABSTRACT

A method for making a semiconductor chip includes disposing copper interconnects adjacent via channels and then doping only the portions of the interconnects that lie directly beneath the via channels. Then, the via channels are filled with electrically conductive material. The impurities with which the interconnects are locally doped reduce unwanted electromigration of copper atoms at the interconnect-via interfaces, while not unduly increasing line resistance in the interconnects.

18 Claims, 2 Drawing Sheets

METHOD AND APPARATUS FOR REDUCING ELECTROMIGRATION IN SEMICONDUCTOR INTERCONNECT LINES

RELATED APPLICATION(S)

This application is a divisional application, claiming priority from U.S. patent application Ser. No. 09/294,454, filed Apr. 19, 1999, now U.S. Pat. No. 6,346,470.

TECHNICAL FIELD

The present invention relates generally to semiconductor fabrication, and more particularly to methods for reducing the electromigration of copper at interconnect-via interfaces in semiconductor devices such as very- and ultra-large scale integration (VLSI/ULSI) devices.

BACKGROUND OF THE INVENTION

Semiconductor chips or wafers are used in many applications, including as processor chips for computers, and as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

Accordingly, a single chip can contain a large number of electrical circuit components, including transistors. As will be readily appreciated, the circuit components of a chip must be electrically connected to other components to establish an electrical circuit. With this in mind, very small electrical leads, referred to as "interconnects," are used to electrically connect circuit components to other appropriate circuit components and devices. As part of establishing electrical contact between an, interconnect and, for example, a transistor having a source and drain embedded in a dielectric material, a channel is formed through the dielectric material for each source and drain. The channel is filled with a conductor referred to as "via," with the interconnects then disposed in contact with the vias to establish proper electrical communication with the transistor.

As recognized by the present invention, when an interconnect is made of copper, electromigration of copper atoms from the interconnect into the via can occur. This can result in the formation of voids at the via-interconnect interface, which undesirably reduces the performance of the circuit by increasing the electrical resistance at the interface. As further recognized herein, the above-described electromigration can be reduced by doping the copper interconnects with impurities, but the impurities in turn can undesirably increase the resistance of the copper interconnect. Fortunately, the present invention addresses the problem of reducing electromigration at via-interconnect interfaces while minimizing the resistance of the interconnect.

BRIEF SUMMARY OF THE INVENTION

A method is disclosed for establishing an electrical connection to a circuit component in a semiconductor device. The method includes disposing a portion of an interconnect adjacent a circuit component location, and doping the portion of the interconnect with an impurity to establish a doped portion. Then, electrical contact is established between the doped portion of the interconnect and the circuit component. The impurity can be selected from the group including: Palladium (Pd), Zirconium (Zr), Tin (Sn), Magnesium (Mg), and Scandium (Sc).

In a preferred embodiment, the device includes a layer of dielectric material. In this preferred embodiment, the method further includes forming a channel through the dielectric material, and directing the impurity through the channel into the interconnect such that the impurity is implanted into the interconnect. The impurity can be implanted using ion implantation, plasma enhanced deposition, or thermal diffusion. An electrically conductive via material is then disposed in the channel for establishing electrical contact between the doped portion of the interconnect and the circuit component (e.g., the source or drain of a transistor). A semiconductor device made according to the present method, as well as a digital processing apparatus incorporating the device, are also disclosed.

In another aspect, a method for making a large scale integration semiconductor device includes arranging plural circuit components on a substrate, and also arranging plural interconnects adjacent the circuit components. At least some interconnects have doped portions and undoped portions. The method further contemplates establishing electrical contact between at least some of the doped portions of the interconnects and at least some of the circuit components.

In still another aspect, a semiconductor device includes a circuit component including at least one via, and an interconnect having at least one doped portion disposed entirely beneath the via in electrical contact therewith. Portions of the interconnect that are contiguous to the doped portion are not doped. Other features of the present invention are disclosed or apparent in the section entitled "DETAILED DESCRIPTION OF THE INVENTION."

BRIEF DESCRIPTION OF DRAWINGS

For a better understanding of the present invention, reference is made to the below-referenced accompanying drawings. Reference numbers refer to the same or equivalent parts of the present invention throughout the several figures of the drawings.

DETAILED DESCRIPTION OF THE INVENTION

Figure 1:
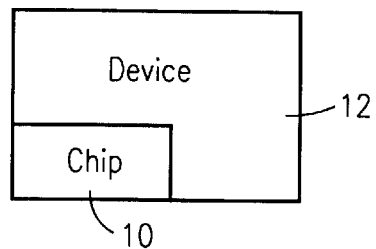
FIG. 1 is a schematic diagram of a semiconductor device made, according to the present invention, shown in combination with a digital processing apparatus.

Referring initially to FIG. 1, a semiconductor device embodied as a chip 10 is shown incorporated into a digital processing apparatus such as a computer 12. The chip 10 is made in accordance with the below disclosure.

Figure 2:
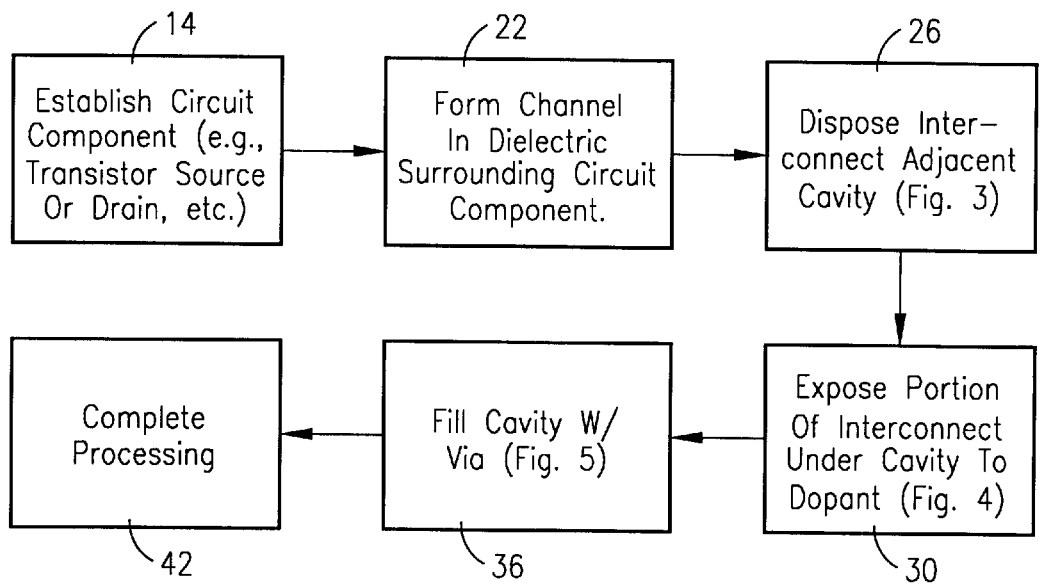
FIG. 2 is a flow chart showing the steps of the present invention.
Figure 3:
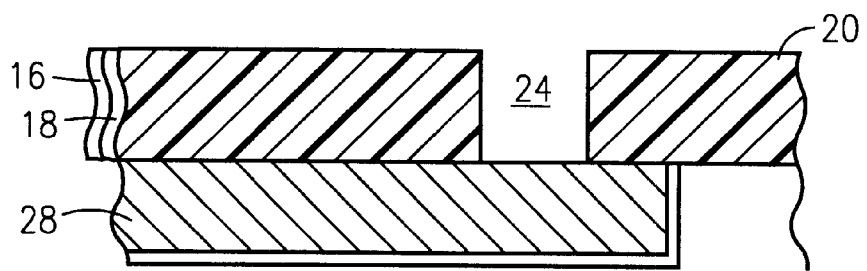
FIG. 3 is a side view of the device after forming a channel in a dielectric layer of the device, schematically showing the circuit component beneath the dielectric layer and the substrate beneath the circuit component, in accordance with the present invention.

Now referring to FIGS. 2 and 3, as indicated at block 14 in FIG. 2 and as shown in FIG. 3, a silicon substrate 16 is provided, and circuit components 18 are arranged on the substrate 16 in accordance with VLSI/ULSI principles known in the art. In the exemplary embodiment shown, the circuit component 18 is a metal oxide field effect transistor (MOSFET) that includes a source and a drain, electrical connections to which are the focus of the present invention. It is to be understood, however, that the principles of the present invention apply to circuit components other than MOSFET transistors.

In accordance with semiconductor chip design principles, the circuit component 18 is beneath a layer 20 of dielectric material, such as, a field oxide layer. As indicated at block 22 of FIG. 2 and as shown in FIG. 3, a via channel 24 is formed in the dielectric layer 20 in accordance with principles known in the art.

Proceeding to block 26 in FIG. 2 and still referring to FIG. 3, an electrically conductive interconnect 28 is disposed adjacent the channel 24. In the preferred embodiment, the interconnect 28 is made of Copper (Cu). Alternatively, the interconnect 28 can be made of other suitable material, such as Aluminum (Al). Preferably, the interconnect 28 is disposed parallel to and against the dielectric layer 20 as shown.

Figure 4:
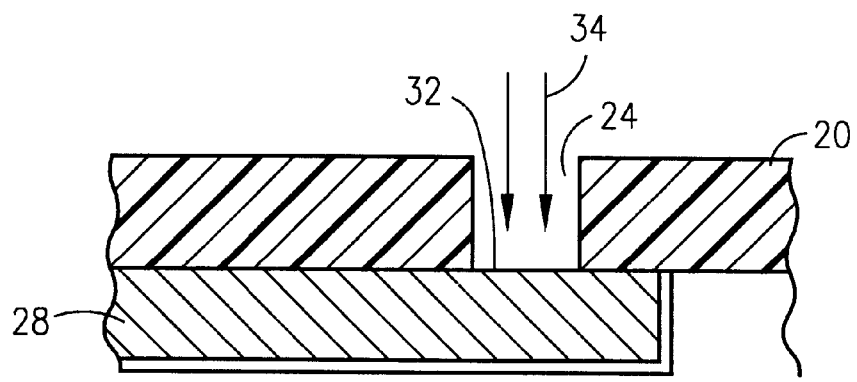
FIG. 4 is a side view of the device during doping of the interconnect with an impurity, with the circuit device omitted for clarity, in accordance with the present invention.

Continuing to block 30 in FIG. 2 and now considering FIG. 4, a portion 32 of the interconnect 28 is exposed to a dopant, represented by the arrows 34. As can be appreciated looking at FIG. 4, the dopant is directed through the via channel 24, such that the portion 32 of the interconnect 28 that is exposed to the dopant lies entirely beneath the via channel 24. As envisioned by the present invention, the dopant is one or more impurities selected from the group of impurities including Palladium (Pd), Zirconium (Zr), Tin (Sn), Magnesium (Mg), and Scandium (Sc).

In accordance with the present invention, the dopant 34 is implanted into the portion 32 of the interconnect 28 using ion implantation principles. Alternatively, the dopant 34 is implanted into the portion 32 of the interconnect 28 using plasma enhanced deposition principles or thermal diffusion principles.

Figure 5:
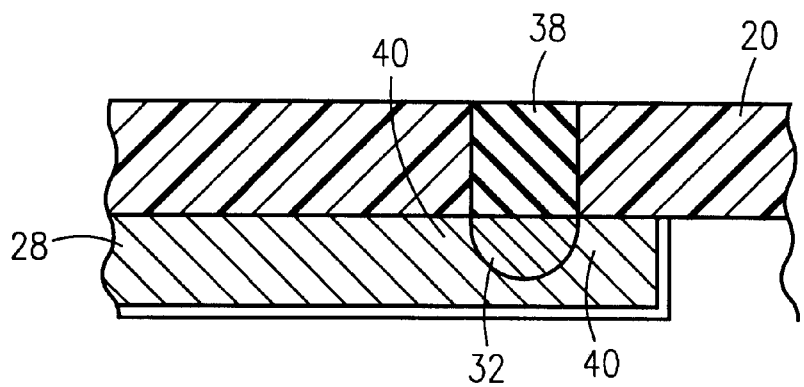
FIG. 5 is a side view of the device after the channel has been filled in with an electrically conductive via material, with the circuit device omitted for clarity, in accordance with the present invention.

Moving to block 36 in FIG. 2 and referring to FIG. 5, an electrically conductive via material 38 is disposed in the channel 24 to establish electrical contact between the doped portion 32 of the interconnect 28 and the circuit component 18 (FIG. 3). In cross-reference to FIGS. 4 and 5, due to the doping step, the only portion of the interconnect 28 that is doped is the doped portion 32, such that undoped portions 40 of the interconnect 28 are contiguous to the doped portion 32. In accordance with present principles, the interconnect 28 can include additional doped portions that are adjacent additional vias of other circuit components, with the additional doped portions bordering undoped portions. Processing is conventionally completed at block 42 of FIG. 2.

With the above disclosure in mind, owing to the doped portion 32 of the interconnect 28 electromigration across the via 38-interconnect 28 interface advantageously is reduced, vis-a-vis the electromigration that might otherwise occur if the interconnect 28 was not doped. Overall electrical resistance of the interconnect 28, however, is not unduly increased by doping, because the doped portion 32 represents only a relatively small fraction of the interconnect 28, with the undoped portions 40 constituting most of the interconnect 28.

While the particular METHOD AND APPARATUS FOR REDUCING ELECTROMIGRATION IN SEMICONDUCTOR INTERCONNECT LINES, as herein shown and described in detail, is fully capable of attaining the above-described objects of the invention, this is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." Indeed, although a single transistor structure is shown in the drawings for clarity, the skilled artisan will appreciate that the chip 10 can include plural transistors, each substantially identical to that shown, as well as other circuit components. All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for."

What is claimed is:

1. A large scale integration semiconductor device, comprising:
   at least one interconnect;
   a circuit component,
      a portion of the at least one interconnect disposed adjacent to a portion of the circuit component, and
      the portion of the at least one interconnect doped with an impurity to establish a doped interconnect portion; and
   at least one electrical contact established between the doped interconnect portion and the circuit component portion,
   wherein the impurity comprises at least one element selected from a group consisting essentially of: Palladium (Pd), Zirconium (Zr), Tin (Sn), Magnesium (Mg), and Scandium (SC).

2. A digital processing apparatus incorporating the device, as recited in claim 1.

3. A device, as recited in claim 1, further comprising a dielectric material, wherein at least one channel is formed through the dielectric material, and wherein the impurity is directed through the at least one channel into the at least one interconnect.

4. A device, as recited in claim 3, further comprising an electrically conductive material disposed in the at least one channel for establishing an electrical contact between the doped interconnect portion and the circuit component portion.

5. A device, as recited in claim 3,
   wherein the circuit component comprises a transistor, and
   wherein the circuit component portion comprises a component feature selected from a group of features consisting essentially of a source and a drain.

6. A device, as recited in claim 1, wherein the portion of the at least one interconnect is doped with the impurity to establish the doped interconnect portion by using ion implantation.

7. A device, as recited in claim 1, wherein the portion of the at least one interconnect is doped with the impurity to establish the doped interconnect portion by using plasma enhanced deposition.

8. A device, as recited in claim 1, wherein the portion of the at least one interconnect is doped with the impurity to establish the doped interconnect portion by using thermal diffusion.

9. A large scale integration semiconductor device, comprising:
   a plurality of circuit components arranged on a substrate;
   a plurality of interconnects arranged adjacent to the plurality of circuit component portions, at least one interconnect of said plurality of interconnects comprising:
      at least one doped interconnect portion comprising an impurity; and
      at least one undoped interconnect portion; and
   an electrical contact established between the at least one doped interconnect portion and at least one of the plurality of circuit component portions,
   wherein the impurity comprises at least one element selected from a group consisting essentially of: Palladium (Pd), Zirconium (Zr), Tin (Sn), Magnesium (Mg), and Scandium (Sc).

10. A digital processing apparatus incorporating the device, as recited in claim 9.

11. A device, as recited in claim 9, further comprising a dielectric material,
   wherein at least one channel is formed through the dielectric material, and
   wherein the impurity is directed through the at least one channel into the at least one interconnect.

12. A device, as recited in claim 11, further comprising an electrically conductive material disposed in the at least one channel for establishing an electrical contact between the doped interconnect portion and the circuit component portion.

13. A device, as recited in claim 11,
   wherein the circuit component comprises a transistor, and
   wherein the circuit component portion comprises a component feature selected from a group consisting essentially of a source and a drain.

14. A device, as recited in claim 9, wherein the portion of the at least one interconnect is doped with the impurity to establish the doped interconnect portion by using ion implantation.

15. A device, as recited in claim 9, wherein the portion of the at least one interconnect is doped with the impurity to establish the doped interconnect portion by using plasma enhanced deposition.

16. A device, as recited in claim 9, wherein the portion of the at least one interconnect is doped with the impurity to establish the doped interconnect portion by using thermal diffusion.

17. A large scale integration semiconductor device, comprising:
   at least one circuit component comprising at least one via;
   at least one interconnect comprising at least one doped portion disposed entirely beneath the at least one via in electrical contact therewith,
      wherein portions of the at least one interconnect that are contiguous to the doped portion are undoped, and
      wherein the portion of the at least one interconnect is doped with an impurity to establish the doped interconnect portion by using a technique selected from a group consisting of ion implantation, plasma enhanced deposition, and thermal diffusion;
   a dielectric material,
      wherein at least one channel is formed through the dielectric material, and
      wherein the impurity is directed through the at least one channel into the at least one interconnect; and
   an electrically conductive material disposed in the at least one channel for establishing an electrical contact between the doped interconnect portion and the circuit component portion,
   wherein the impurity comprises at least one element selected from a group consisting essentially of: Palladium (Pd), Zirconium (Zr), Tin (Sn), Magnesium (Mg), and Scandium (Sc),
   wherein the circuit component comprises a transistor, and
   wherein the circuit component portion comprises a component feature selected from a group of features consisting essentially of a source and a drain.

18. A digital processing apparatus incorporating the device, as recited in claim 17.

* * * * *